United States Patent [19]

Tohnishi

[11] Patent Number: 5,022,005
[45] Date of Patent: Jun. 4, 1991

[54] SEMICONDUCTOR MEMORY DEVICE HAVING PLURAL BIASING CIRCUITS FOR SUBSTRATE

[75] Inventor: Shigeji Tohnishi, Tokyo, Japan
[73] Assignee: NEC Corporation, Tokyo, Japan
[21] Appl. No.: 391,891
[22] Filed: Aug. 10, 1989
[30] Foreign Application Priority Data Aug. 10, 1988 [JP] Japan .................. 63-200494

[51] Int. Cl.$^5$ .................................. G11C 7/00
[52] U.S. Cl. .......................... 365/189.09; 365/226; 307/296.2
[58] Field of Search ............. 365/51, 63, 189.09, 365/226; 323/314, 315, 316; 307/296.2

[56] References Cited

U.S. PATENT DOCUMENTS 4,535,423  8/1985  Nozaki et al. .................. 365/51
4,760,560  7/1988  Ariizumi et al. ............. 365/189.09

Primary Examiner—Joseph A. Popek
Attorney, Agent, or Firm—Sughrue, Mion, Zinn, Macpeak & Seas

[57] ABSTRACT

A dynamic random access memory device according to the present invention has a plurality of memory cells each of the one-transistor and one-capacitor type and a plurality of biasing circuits for injecting electrons into the semiconductor substrate so as to establish a predetermined reverse biasing state, and the biasing circuits are located in spacing relationship from one another, so that a large difference in electron density does not take place in the substrate, and, accordingly, a data bit in the form of positive electric charges is less liable to be destroyed even if the storage capacitor is located in the vicinity of the biasing circuits.

6 Claims, 3 Drawing Sheets

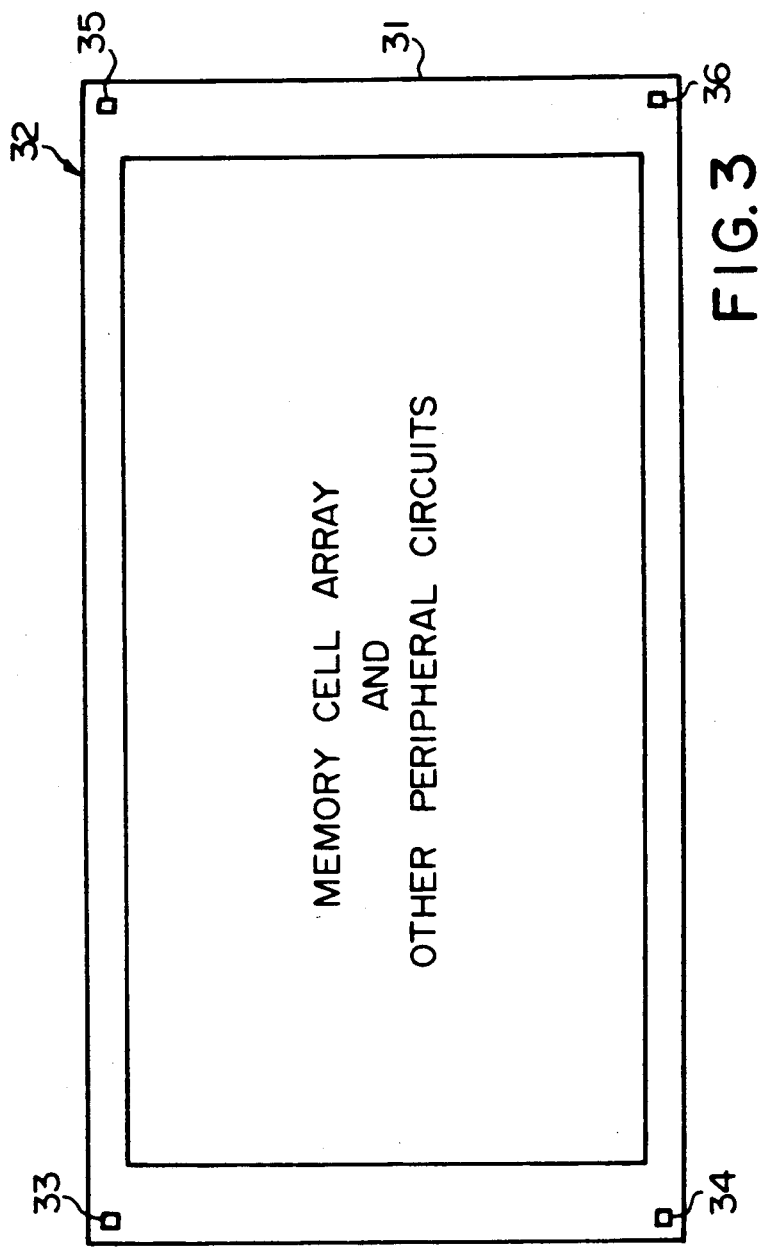

SEMICONDUCTOR MEMORY DEVICE HAVING PLURAL BIASING CIRCUITS FOR SUBSTRATE

FIELD OF THE INVENTION

This invention relates to a semiconductor memory device and, more particularly, to a biasing circuit for the substrate where the semiconductor memory device is fabricated.

DESCRIPTION OF THE RELATED ART

A practical dynamic random access memory device is implemented by a large number of field effect transistors, storage capacitors as well as other component elements, and these component elements are integrated on a signal semiconductor substrate. The field effect transistors and the associated storage capacitors form in combination dynamic memory cells which are arranged in a memory cell array associated with various peripheral circuits. Each of the field effect transistors is formed by two p-n junctions spaced apart from each other by a channel forming region, and a gate structure is provided on the channel forming region. The p-n junctions define source and drain regions, respectively, and are, by way of example, formed by doping impurity atoms of one conductivity type into a silicon substrate of the opposite conductivity type. The p-n junctions should be reversely biased so as to confine the carriers in the source and drain regions, and, for this reason, a biasing circuit is incorporated in the random access memory device. The biasing circuit provides an appropriate reverse biasing to the p-n junctions.

However, a problem is encountered in the prior art semiconductor memory device in that data bits tend to be destroyed in the storage capacitors formed in the vicinity of the biasing circuit, and the destruction becomes serious in an ultra large scale integration.

In detail assuming now that n-channel type field effect transistors are fabricated on the p-type semiconductor substrate, a data bit is stored in the storage capacitor in the form of positive electric charges, and the biasing circuit injects negative charges in the semiconductor substrate.

While the integration density is not so large, each storage capacitor occupies a relatively large amount of area, and a relatively large amount of the positive charges are accumulated in the storage capacitor. Since a relatively small number of the memory cells are fabricated on a small size semiconductor substrate, a small amount of the negative charges appropriately bias the semiconductor substrate to a certain negative voltage level, and, for this reason, the biasing circuit is small in size and capability. In this situation, a relatively wide margin takes place between the effective charges in the storage capacitor and the extinct charges recombined with the injected negative charges, and, accordingly, the data bit is less susceptible to the injected negative charges.

However, the ultra large scale integration consumes a large amount of area, and the semiconductor substrate is enlarged in size. On the other hand, each of the component field effect transistor as well as the storage capacitor are miniatured so as to allow a large number of the component elements to be integrated thereon. A relatively large amount of the negative charges are injected from the biasing circuit into the large semiconductor substrate, however, a relatively small amount of the positive charges are stored in the storage capacitor. Since the injected negative charges are diffused in the semiconductor substrate, the data bit may not be destroyed if stored in the memory cell far from the biasing circuit. However, if the data bit is stored in the memory cell in the vicinity of the biasing circuit, the margin between the effective charges and the extinct charges is decreased, and the data bit is much susceptible to the injected negative charges. In other words, the data bit tends to be destroyed by the injected negative charges.

SUMMARY OF THE INVENTION

It is therefore an important object of the present invention to provide a semiconductor memory device which provides a stable storage for data bits.

It is also an important object of the present invention to provide a semiconductor memory device the biasing unit of which is less liable to affect the data bits stored in the memory cells adjacent thereto.

To accomplish these objects, the present invention proposes to provide a plurality of small biasing circuits straggling over the semiconductor substrate.

In accordance with the present invention, there is provided a semiconductor memory device fabricated on a semiconductor substrate, comprising: (a) a plurality of memory cells operative to store data bits each in the form of electric charges; and (b) peripheral circuits provided in association with the memory cells for writing and reading the data bits and including a biasing unit for supplying the semiconductor substrate with a predetermined biasing voltage, in which the biasing unit has a plurality of biasing circuits located in spacing relationship from one another.

BRIEF DESCRIPTION OF THE DRAWINGS

The features and advantages of a semiconductor memory device according to the present invention will be more clearly understood from the following description taken in conjunction with the accompanying drawings in which:

FIG. 3 is a plan view showing the layout of another semiconductor memory device embodying the present invention.

DESCRIPTION OF THE PREFERRED EMBODIMENTS

First embodiment

Figure 1:
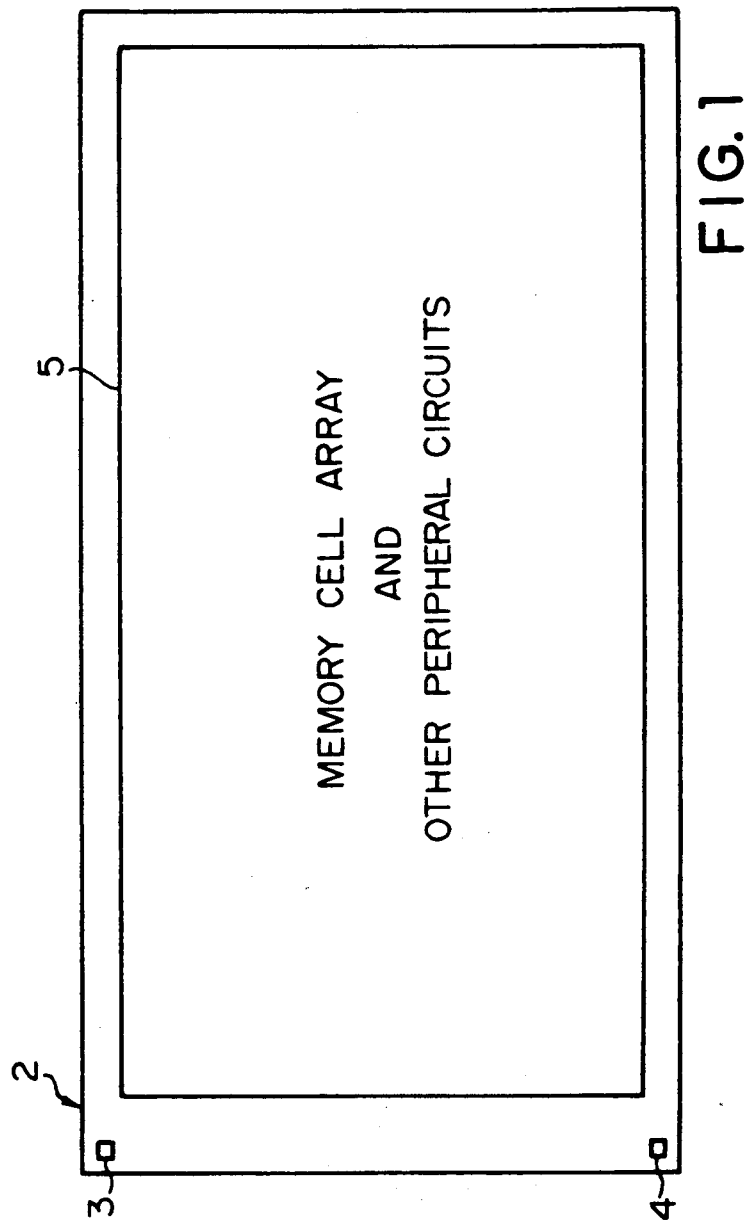
FIG. 1 is a plan view showing the layout of a semiconductor memory device embodying the present invention.

Referring first to FIG. 1 of the drawings, a random access memory device is fabricated on a silicon substrate 1 relatively small in size, and the silicon substrate 1 has a generally rectangular major surface. A biasing unit 2 is constituted by two biasing circuits 3 and 4 which are located at two corners of the left side. However, a memory cell array and other peripheral circuits are formed in the central zone 5 of the major surface, and the other peripheral circuits as well as the biasing unit 2 are provided for supporting writing-in and reading-out operations. Since the biasing unit 2 is constituted by the two biasing circuit 3 and 4, each of the biasing circuits 3 and 4 is relatively small in electron injecting capability. In this instance, each of the biasing circuits 3 and 4 is implemented by a combination of a capacitor C and two diodes D1 and D2, and the capacitor C is coupled at one end thereof to an oscillator OSC producing an oscillation signal. Between the other electrode of the capacitor C and the ground node is coupled to the diode D2 which clamps the other electrode at a certain voltage level higher than the ground voltage level by the forwardly biasing voltage level of the diode D2 of, for example, about 0.1 to 0.3 volt in the presence of the oscillation signal of the positive high voltage level. The diode D1 is coupled between the other electrode of the capacitor C and the substrate 1, and is blocked in so far as the oscillation signal remains in the positive high voltage level. However, when the oscillation signal is recovered to the low voltage level, the other electrode of the capacitor C is decreased from the cerain voltage level, and the substrate 1 goes down a negative voltage level. The above mentioned phenomenon repeatedly takes place and allows the substrate to remain in the negative voltage level throughout the activated period.

Figure 2:
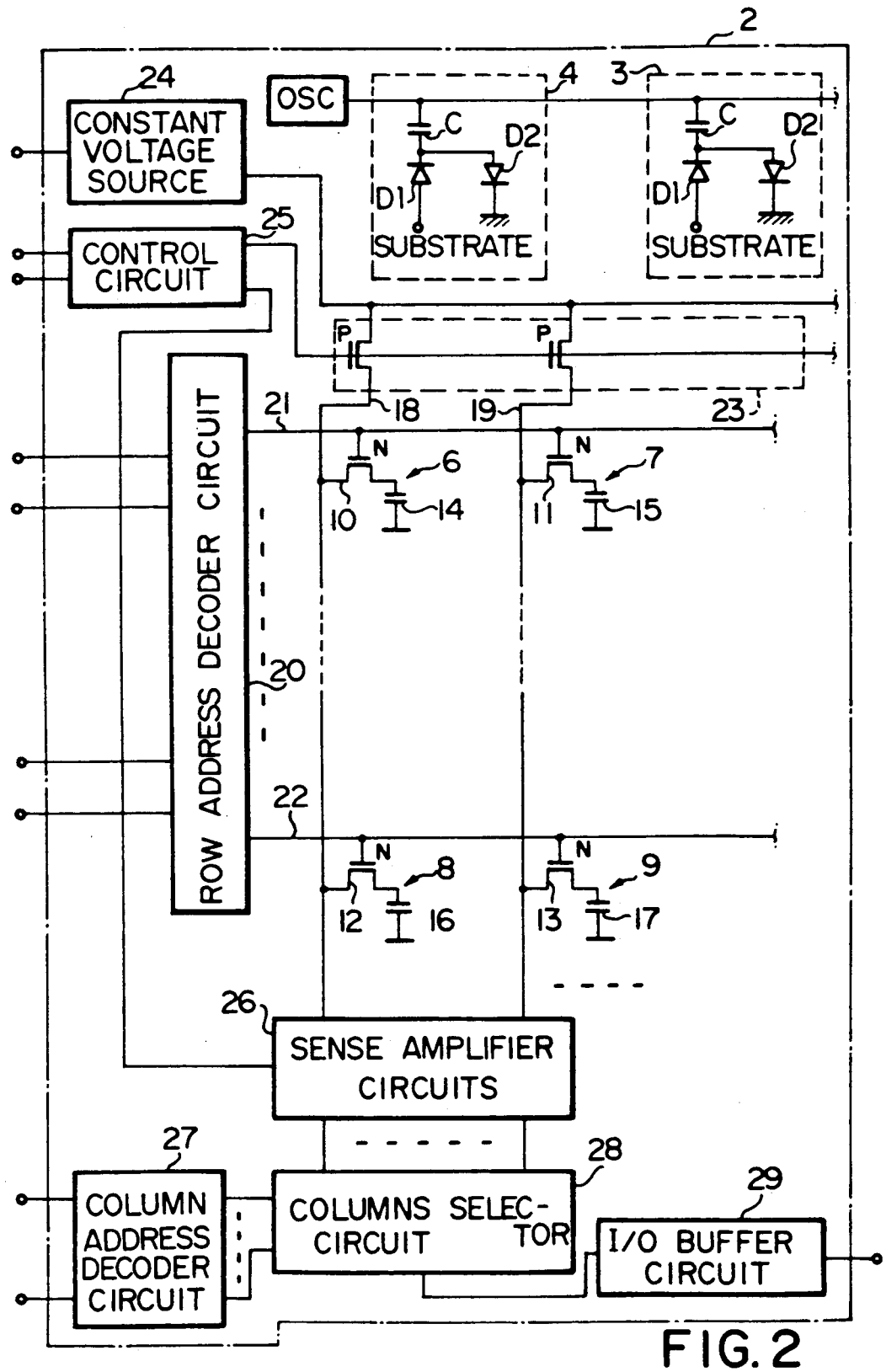
FIG. 2 is a circuit diagram showing the semiconductor memory device shown in FIG. 1.

In detail, the memory cell array consists of a plurality of memory cells (only four of which are illustrated and designated by reference numerals 6, 7, 8 and 9 in FIG. 2), and the memory cells are of the one-transistor and one-capacitor type. The memory cells 6 to 9 respectively have series combinations of n-channel type field effect transistors 10, 11, 12 and 13 and storage capacitors 14, 15, 16 and 17, and the series combinations are coupled between bit lines 18 and 19 and the silicon substrate 1.

The other peripheral circuits include a row address decoder circuit 20 associated with word lines 21 to 22 respectively coupled to the n-channel type field effect transistors 6 to 9, a precharging circuit 23, a constant voltage source 24, a control circuit 25, sense amplifier circuits 26, a column address decoder circuit 27, a column selector circuit 28 and an input-and-output buffer circuit 29. The behaviors of these circuits are well known in the art, so that no further description is incorporated hereinbelow.

Assuming now that a data bit of logic "1" level is written into the memory cell 6, positive electric charges are accumulated in the storage capacitor 14. The biasing circuits 3 and 4 continue to inject the electrons in the silicon substrate 1, however, the silicon substrate 1 is shared by the two biasing circuits 3 and 4, so that a large difference in the electron density hardly takes place in the substrate. This results in that positive electric charges in the storage capacitor 14 are less liable to be attacked by the injected electrons, and, accordingly, the data bit is stable in the capacitor 14.

Second embodiment

Turning to FIG. 3, a video random access memory device (which is frequently abbreviated to "VRAM") is fabricated on a relatively large silicon substrate 31, and the silicon substrate 31 has a generally rectangular major surface. A biasing unit 32 is constituted by four biasing circuits 33, 34, 35 and 36 which are located at four corners of the major surface. The silicon substrate 31 used for the video random access memory device is large enough to form the four biasing circuits. By virtue of the four biasing circuits 33 to 36 arranged at the four corners, the electron density is further equalized over the silicon substrate 31, and, for this reason, a data bit are hardly destroyed by the injected electrons.

Although particular embodiments of the present invention have been shown and described, it will be obvious to those skilled in the art that various changes and modifications may be made without departing from the spirit and scope of the present invention.

What is claimed is:

1. A semiconductor memory device fabricated on a semiconductor substrate, comprising:
   (a) a plurality of memory cells operative to store data bits in the form of electric charges; and
   (b) peripheral circuits provided in association with said memory cells for writing and reading the data bits and including a biasing unit for supplying said semiconductor substrate with a predetermined biasing voltage, in which said biasing unit has a plurality of biasing circuits located in spaced relationship from one another, and in which said biasing circuits cooperate with one another in biasing said semiconductor substrate to said predetermined biasing voltage.

2. A semiconductor memory device as set in claim 1, in which said semiconductor substrate has a generally rectangular major surface, and in which said biasing circuits are located at two corners of the major surface, respectively.

3. A semiconductor memory device as set forth in claim 2, in which said semiconductor memory device is of the random access memory.

4. A semiconductor memory device as set forth in claim 3, in which each of said memory cells is formed by a series combination of a gate transistor and a storage capacitor, and in which p-n junctions are formed between the respective gate transistors an the substrate.

5. A semiconductor memory device as set forth in claim 1, in which said semiconductor substrate has a generally rectangular major surface, and in which said biasing circuits are located at four corners of the major surface, respectively.

6. A semiconductor memory device as set forth in claim 5, in which said semiconductor memory device is of the video random access memory.

* * * * *